US007126857B2

(12) United States Patent
Hajeck

(10) Patent No.: US 7,126,857 B2
(45) Date of Patent: *Oct. 24, 2006

(54) STORAGE SUBSYSTEM WITH EMBEDDED CIRCUIT FOR PROTECTING AGAINST ANOMALIES IN POWER SIGNAL FROM HOST

(75) Inventor: Michael J. Hajeck, San Juan Capistrano, CA (US)

(73) Assignee: SiliconSystems, Inc., Aliso Viejo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/037,728

(22) Filed: Jan. 18, 2005

(65) Prior Publication Data

US 2005/0122791 A1    Jun. 9, 2005

Related U.S. Application Data

(63) Continuation of application No. 10/406,805, filed on Apr. 3, 2003, now Pat. No. 6,856,556.

(51) Int. Cl.
    *G11C 7/10* (2006.01)
(52) U.S. Cl. .................. 365/189.01; 365/191; 365/226
(58) Field of Classification Search ........... 365/189.11, 365/212, 185.33, 226, 228, 229, 185.18, 365/189.01, 191, 225.7, 189.08
See application file for complete search history.

(56) References Cited

U.S. PATENT DOCUMENTS

| | | | |
|---|---|---|---|
| 5,596,532 A * | 1/1997 | Cernea et al. ......... 365/185.18 |
| 5,693,570 A | 12/1997 | Cernea et al. |
| 5,706,239 A | 1/1998 | Brys |
| 5,781,473 A | 7/1998 | Javanifard et al. |
| 5,798,961 A | 8/1998 | Heyden et al. |
| 5,873,112 A | 2/1999 | Norman |
| 5,880,622 A * | 3/1999 | Evertt et al. ................. 327/535 |
| 6,424,570 B1 | 7/2002 | Le et al. |
| 6,515,903 B1 | 2/2003 | Le et al. |
| 6,532,178 B1 | 3/2003 | Taub |
| 6,552,933 B1 | 4/2003 | Roohparvar |
| 6,678,189 B1 | 1/2004 | Tran |
| 6,856,556 B1 * | 2/2005 | Hajeck .................. 365/189.11 |
| 2002/0114184 A1 | 8/2002 | Gongwer et al. |
| 2003/0048673 A1 | 3/2003 | Naso et al. |
| 2004/0001379 A1 * | 1/2004 | Azuma ........................ 365/202 |

* cited by examiner

*Primary Examiner*—Richard Elms
*Assistant Examiner*—Dang Nguyen
(74) *Attorney, Agent, or Firm*—Knobbe, Martens, Olson & Bear LLP

(57) ABSTRACT

A storage subsystem, such as a flash memory card, includes a voltage detection circuit that monitors the power signal from a host system to detect anomalies. The voltage detection circuit responds to a power signal anomaly by asserting a signal, such as a busy signal on a standard ready/busy signal line, to block the host system from performing write operations to the storage subsystem during presence of the anomaly. The storage system may also include a backup power source, such as a charge pump circuit, a capacitive array, and/or a rechargeable battery, that provides power to a controller of the storage subsystem during the presence of the anomaly, such that the storage system can complete outstanding operations.

32 Claims, 2 Drawing Sheets

STORAGE SUBSYSTEM WITH EMBEDDED CIRCUIT FOR PROTECTING AGAINST ANOMALIES IN POWER SIGNAL FROM HOST

RELATED APPLICATIONS

This application is a continuation of U.S. application Ser. No. 10/406,805, filed Apr. 3, 2003 now U.S. Pat. No. 6,856,556.

BACKGROUND OF THE INVENTION

1. Field of the Invention

The present invention relates to circuits from protecting storage subsystems, such as but not limited to flash memory cards, from damage and data loss caused by irregularities in a power signal provided by a host.

2. Description of the Related Art

A significant problem in the area of storage subsystems relates to data loss, data corruption, and circuitry damage caused by interruptions and other irregularities in the power signal supplied by the host system. For example, in the context of a flash memory subsystem, an unexpected power loss can cause a sector write operation to terminate prematurely, resulting in a mismatch between a sector's data and ECC portions. In addition to losing the write data, the memory subsystem's controller may thereafter respond to the ECC mismatch condition by treating the sector as defective, and unnecessarily replacing the sector with a spare sector. Incomplete sector write operations can also result in data loss and sector replacement in disk drives that store data on a rotating medium. Other types of power signal anomalies, such as power surges and spikes, can additionally cause permanent damage to the circuitry of the storage subsystem.

SUMMARY OF THE INVENTION

The present invention provides a circuit and associated method for protecting a storage subsystem from irregularities in a power signal supplied by a host system. The invention may be embodied within a variety of different types of storage subsystems, including but not limited to non-volatile solid state memory cards (such as but not limited to those that comply with the CompactFlash, PCM-CIA, . SmartMedia, MultiMediaCard, SecureDigital and Memory Stick card specifications), volatile and non-volatile solid-state storage products in disk drive form factors, electro-mechanical disk drives, and volatile and non-volatile solid-state storage products in a variety of industry standard and custom form factors. No modifications are needed to the host system.

In one embodiment, the storage subsystem includes a voltage detection circuit that monitors the power signal from the host system to detect anomalies. The voltage detection circuit responds to a power signal anomaly by asserting a signal, such as a busy signal on a standard ready/busy signal line, to block the host system from performing write operations to the storage subsystem. The storage system may also include a backup power source, such as a charge pump circuit, a capacitive array, and/or a rechargeable battery, that provides power to a controller of the storage subsystem during presence of the anomaly, such that the controller can complete outstanding operations and/or perform a shutdown sequence.

BRIEF DESCRIPTION OF THE DRAWINGS

Specific embodiments of the invention will now be described with reference to the following drawings, which are intended to illustrate and not limit the invention.

DETAILED DESCRIPTION OF THE PREFERRED EMBODIMENTS

Figure 1:
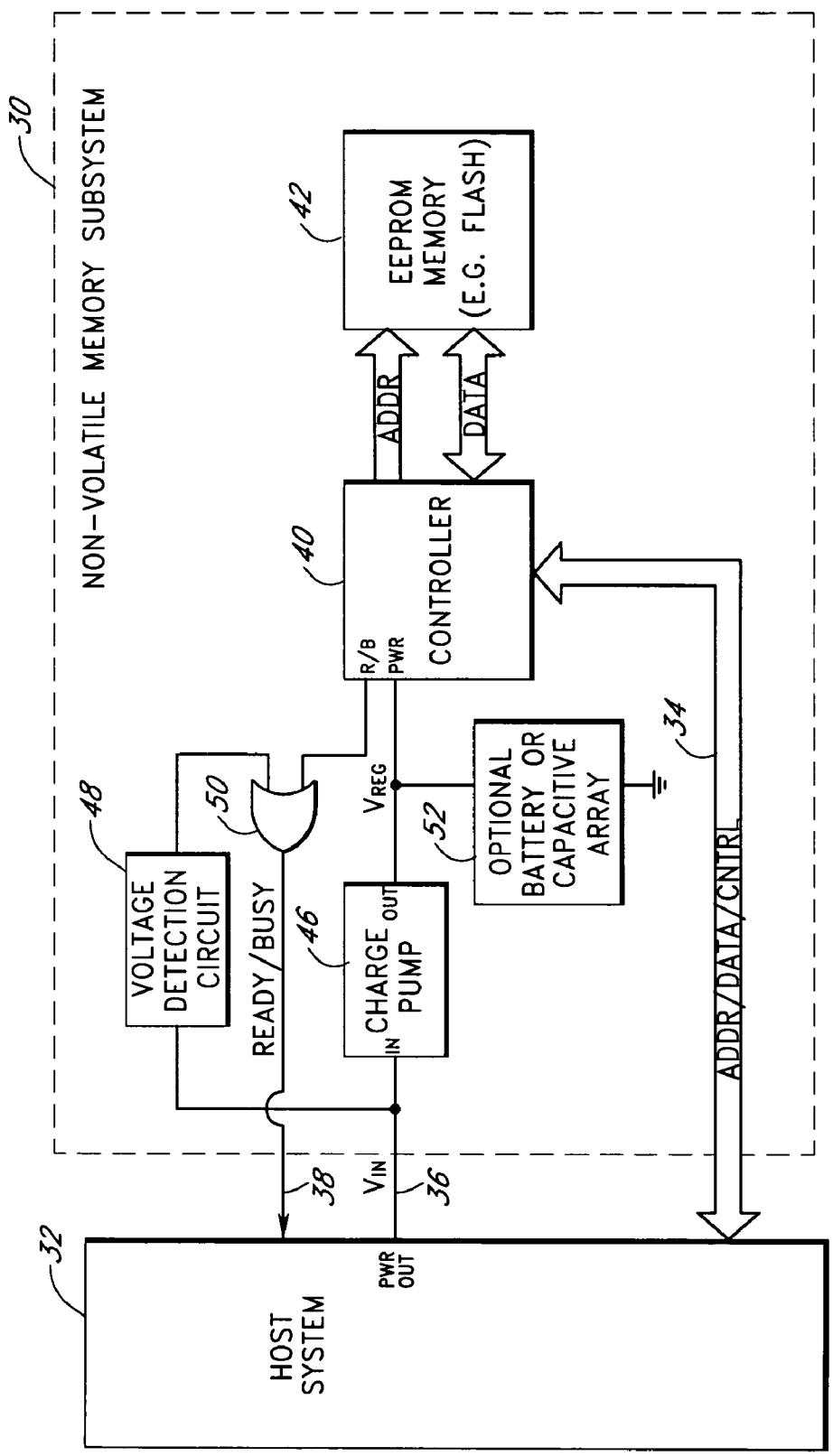
FIG. 1 illustrates the design- of a non-volatile solid state memory subsystem according to one embodiment of the invention.

FIG. 1 illustrates a solid state memory subsystem 30 according to one embodiment of the invention. The memory subsystem 30 may, for example, be a flash memory card that conforms to one of the aforementioned card specifications, although the invention is not so limited. The memory subsystem plugs into a slot of, or otherwise attaches to, a host system 32 (hereinafter "host"). The host may be any type of conventional system or device that accepts the memory subsystem, and need not include any special hardware or software for implementing the present invention.

The interface between the memory subsystem 30 and the host 32 includes the following conventional signal lines: a set of address/data/control lines 34 for transferring data; at least one power line 36 over which the host provides a power signal to the memory subsystem; and a ready/busy signal line 38 that is driven by the memory subsystem to notify the host of the subsystem's current status. In implementations in which the particular interface does not include an actual "ready/busy" signal, a different signal or combination of signals may be used to notify the host of the memory subsystem's ready/busy status.

As is conventional, the memory subsystem 30 includes a controller 40 that controls an array of solid state, non-volatile memory 42, which may be flash memory or another type of EEPROM memory. A conventional flash memory controller 40 may be used, as no special controller circuitry or functionality is needed in the illustrated embodiment. In accordance with the invention, the memory subsystem 30 also includes the following components to protect against anomalies in the power signal supplied by the host: a charge pump circuit 46, a voltage detection circuit 48, and a logic gate or switch 50. The switch is shown for illustrative purposes as an OR gate, although other types of gates and switches may be used. The charge pump circuit 46 ("charge pump"), voltage detection circuit 48, and switch 50 may be integrated within a single analog ASIC (application specific integrated circuit), possibly together with other components of the memory subsystem. As depicted by block 52 in the drawing, an optional battery or capacitive array may also be included to provide an additional level of protection against power anomalies.

As illustrated in FIG. 1, the charge pump 46 receives the power signal $V_{IN}$ from the host 32, and supplies a regulated, substantially-constant power signal $V_{REG}$ to the controller 40-and possibly to other active components of the memory subsystem, such as a volatile memory used as a buffer (not shown). Preferably, the charge pump is designed such that the voltage $V_{REG}$ supplied to the controller 40 is maintained at the ideal level (e.g., 5.4 volts) in the event of a brief interruption, drop, increase, or spike in the voltage $V_{IN}$ supplied by the host 32. In addition, the charge pump is preferably designed to protect against sustained voltage drops; for example, in one embodiment, the charge pump is capable of maintaining $V_{REG}$ at 5.4 volts indefinitely as long as $V_{IN}$ exceeds 0.7 volts. The charge pump 46 thus allows the memory subsystem 30 to continue to operate during certain types of power anomalies, including brief power interruptions, spikes and sustained voltage drops. In addition, the charge pump 46 protects the controller 40 from being damaged by spikes and surges in the power signal provided by the host.

The charge pump 46 preferably is or comprises a DC-to-DC step-up/step-down converter. Examples of commercially available charge pump devices that may be used include the ILC6363CIR50 and ILC6383CIRADJ from Fairchild and the MAX849, MAX1705 from Maxim. As is known in the art, the charge pump may optionally include or be followed by a low drop-out (LDO) voltage regulator (not shown) to provide greater output voltage stability. This LDO voltage regulator may be provided in-line between the charge pump's output and the controller's power input, downstream from the optional battery or capacitive array 52 if provided. One example of a voltage regulator device that may be used is a Seiko Epson S80827C.

The voltage detection circuit 48 is responsible for detecting anomalies in the power signal $V_{IN}$ supplied by the host on line 36, and for driving the ready/busy signal to the "busy" state when such anomalies are detected. A conventional voltage detection circuit may be used. The voltage detection circuit 48 may be designed to generate a "busy" signal whenever $V_{IN}$ falls below a certain level, such as 2.6 or 2.7 volts. The voltage detection circuit may also be designed to generate a busy signal when the voltage exceeds a certain level, and/or when other types of anomalies are detected. To inhibit rapid transitions between the "ready" and "busy" states, the voltage detection circuit may be designed to provide a degree of hysteresis, and/or to hold its output for a particular time period after a state transition.

The logic switch 50 logically combines (e.g., ORs) the ready/busy signals generated by the voltage detection circuit 48 and the controller 40 to generate the ready/busy signal provided to the host 32 on line 38. Specifically, if a busy signal is generated by the voltage detection circuit 48, the controller 40, or both the voltage detection and the controller, a busy signal is provided to the host 32. As is known in the art and defined by various interface specifications, the host will not perform new write operations to the memory subsystem when the "busy" state is asserted. Thus, the host 32 is prevented from performing write operations to the memory subsystem when voltage anomalies are detected and signaled by the voltage detection circuit 48. As mentioned above, in implementations in which the particular host-subsystem interface does not include a "ready/busy" signal, the ready/busy status of the memory subsystem 30 may be communicated to the host using a different signal line or combination of signal lines.

The illustrated memory subsystem 30 responds to power signal anomalies generally as follows. Upon detecting the anomaly, the voltage detection circuit 48 generates a busy signal on line 36, causing the host to refrain from writing or reading data to/from the memory subsystem 30. Despite the anomaly in the power input signal, the charge pump 46 continues to provide a near-constant voltage $V_{REG}$ to the controller 40 (for at least a minimum time period $T_{VREG}$, as described below). Because new write operations are inhibited, and because the charge pump continues to provide a regulated power signal to the controller 40, the possibility of data corruption (e.g., as the result of incomplete write operations) is significantly reduced. The charge pump also serves to protect the controller 40 and other circuitry from damage caused by voltage surges and spikes.

Even if the anomaly is in the form of a complete interruption or termination of power from the host 32, the charge pump 46 continues to provide power to the controller 40 (and possibly to other active components, as mentioned above) for at least the minimum time period, $T_{VREG}$, needed to complete all outstanding operations. For example, if a write operation is in progress and the memory subsystem 30 has write data stored in its volatile RAM buffer (not shown), backup power will be provided for a time period sufficient for the controller 40 to finish writing this data to the EEPROM memory 42, and if necessary, to back up any configuration data stored in volatile memory. The memory subsystem 30 may also use the backup power to perform a shut down sequence. The value of $T_{VREG}$ needed to protect against data loss will typically be in the range of several milliseconds to several seconds, depending upon the design and type of the memory subsystem 30.

As depicted by block 52 in FIG. 1, a battery or a capacitive array may be connected between ground and the output of the charge pump 46 to extend the time duration for which backup power is provided. If a battery is used, the battery may be a small, rechargeable, watch-type battery that is embedded within the memory subsystem's housing. Typically, a battery of this type can provide several minutes of backup power to the controller 40. If a capacitive array is provided, the capacitive array may consist of a bank or array of capacitors, and may provide tens to thousands of microfarads of capacitance. The battery or capacitive array, if provided, is connected so as to become or remain charged from the output of the charge pump 46.

The protection circuitry illustrated in FIG. 1 is particularly useful for protecting against power interruptions caused by the removal or movement of the memory subsystem 30 by the user. The protection circuitry also protects against power anomalies emanating from or experienced by the host, and may therefore also find utility in memory subsystems that are not intended to be removed by the user.

Figure 2:
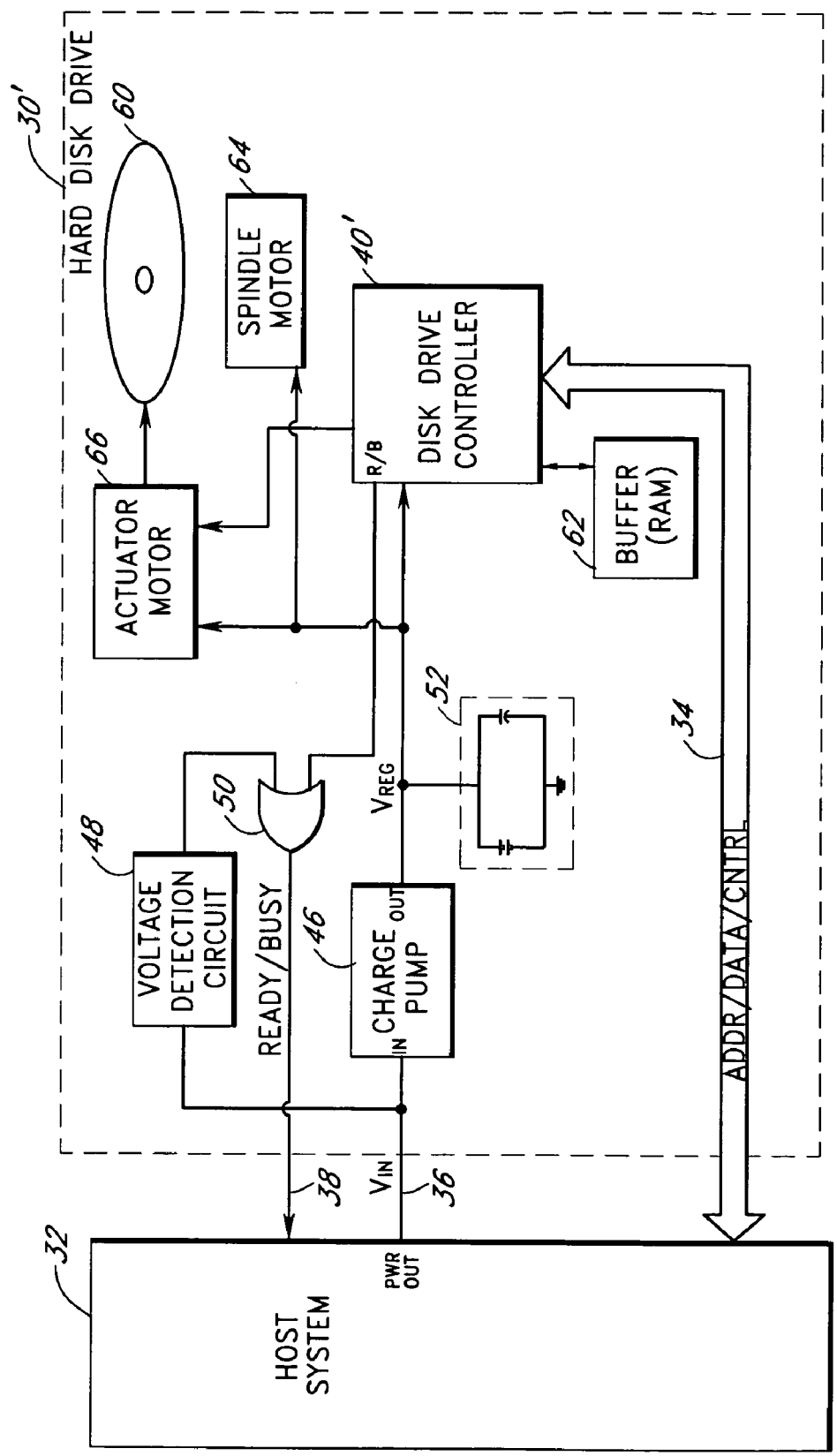
FIG. 2 illustrates the design of a hard disk drive subsystem according to another embodiment of the invention.

FIG. 2 illustrates an embodiment in which the power anomaly protection circuitry is included within a hard disk drive subsystem 30', such as an ATA, Serial ATA, SCSI, or Serial-Attached SCSI disk drive. In this embodiment, the controller 40' is a conventional disk drive controller that controls reads and writes of data to/from a rotating magnetic disk 60. In the illustrated embodiment, the controller 40' accesses a buffer or cache 62 formed from volatile solid state RAM. The design and operation of the power anomaly protection circuitry in this disk drive embodiment may be substantially the same as described with reference to FIG. 1, except that the charge pump (and the optional battery or capacitive array 52) also provide backup power to the spindle and actuator motors 64, 66 of the disk drive 30'.

The protection circuitry and methods of the present invention may also be incorporated into other types of storage subsystems, including volatile storage subsystems that store data within DRAM or SRAM.

Although this invention has been described in terms of certain preferred embodiments and applications, other embodiments and applications that are apparent to those of ordinary skill in the art, including embodiments which do not provide all of the features and advantages set forth herein, are also within the scope of this invention. Accordingly, the scope of the present invention is intended to be defined only by reference to the appended claims.

What is claimed is:

1. A memory subsystem that protects against data losses caused by power signal anomalies, the memory subsystem comprising:
   a solid state non-volatile memory array;
   a controller that transfers data between a host system and the solid state non-volatile memory array;
   a regulation circuit that receives a power signal from the host system, and generates a regulated power signal that is provided to the controller; and
   a voltage detection circuit that monitors the power signal from the host system to detect anomalies therein, wherein the voltage detection circuit responds to detection of an anomaly in the power signal by causing a busy signal to be asserted to the host system, to thereby block the host system from performing write operations to the memory subsystem during presence of the anomaly;
   wherein the memory subsystem is configured for pluggable attachment to the host system.

2. The memory subsystem as in claim 1, wherein the memory subsystem further comprises a backup power source that provides power to the controller when an anomaly is detected by the voltage detection circuit.

3. The memory subsystem as in claim 2, wherein the backup power source comprises a rechargeable battery that is charged when power is supplied to the memory subsystem by the host system.

4. The memory subsystem as in claim 2, wherein the backup power source comprises a capacitive array that is charged when power is supplied to the memory subsystem by the host system.

5. The memory subsystem as in claim 2, wherein the backup power source is configured to provide backup power for a sufficient amount of time to substantially ensure that the controller completes all outstanding operations.

6. The memory subsystem as in claim 5, wherein the backup power source comprises a charge pump circuit.

7. The memory subsystem as in claim 1, further comprising a logic circuit that asserts the busy signal to the host system when either or both of the following occur: (a) an anomaly is detected by the voltage detection circuit; (b) a busy signal is generated by the controller as a result of a memory access operation.

8. The memory subsystem as in claim 1, wherein the busy signal is provided on a ready/busy signal line used to inform the host system of whether the storage subsystem in ready to receive a next command.

9. The memory subsystem as in claim 1, wherein the regulation circuit is capable of maintaining the regulated power signal to the controller when the power signal from the host system is interrupted, such that the regulation circuit acts as a backup power supply when power from the host system is interrupted.

10. The memory subsystem as in claim 1, wherein the memory subsystem is a flash memory card that plugs into a slot of the host system.

11. A method of responding to anomalies in a power signal provided by a host system to a storage subsystem, the method comprising, with the storage subsystem:
    receiving the power signal from the host system, said host system being separate from the storage subsystem and pluggably connecting to the storage subsystem;
    detecting an anomaly in the power signal with a detection circuit of the storage subsystem; and
    in response to detection of the anomaly by the detection circuit, asserting a signal to the host system to inhibit the host system from writing data to the storage subsystem during presence of the anomaly.

12. The method of claim 11, further comprising, during detection of the anomaly by the detection circuit, providing power to a controller of the storage subsystem from at least one source of backup power of the storage subsystem.

13. The method of claim 12, wherein the at least one source of backup power comprises a charge pump circuit.

14. The method of claim 12, wherein the at least one source of backup power comprises a rechargeable battery, and the method further comprises using the power signal to charge the battery.

15. The method of claim 12, wherein the at least one source of backup power comprises a capacitive array, and the method further comprises using the power signal to charge the capacitive array.

16. The method of claim 11, wherein the steps of detecting the anomaly and asserting the signal to the host are performed while the storage subsystem is performing a write operation from the host system, and the method further comprises providing power to a controller of the storage subsystem from at least one source of backup power of the storage subsystem during detection of the anomaly to permit the controller to complete the write operation.

17. The method of claim 11, wherein the storage subsystem is a solid state non-volatile memory card.

18. The method of claim 17, wherein the method further comprises, during detection of the anomaly by the detection circuit, providing power to a controller of the solid state non-volatile memory card from at least one source of backup power embedded within the solid state non-volatile memory card.

19. The method of claim 11, wherein the storage subsystem is a disk drive.

20. The method of claim 11, wherein the signal is a busy signal used to notify the host system that the storage subsystem is currently in a busy state.

21. The method of claim 11, wherein the signal is provided to the host system on a ready/busy signal line of a standard card interface that interconnects the host system and the storage subsystem.

22. The method of claim 11, wherein the signal is generated by a logic circuit that generates the signal when either or both of the following occur: (a) an anomaly is detected by the detection circuit; (b) a busy signal is generated by a controller of the storage subsystem.

23. The method of claim 11, wherein the anomaly is a termination of power from the host system.

24. The method of claim 23, wherein the method further comprises the storage subsystem responding to the termination of power by using at least one source of backup power of the storage subsystem to perform a shut down sequence.

25. The method of claim 11, wherein, by asserting the signal to the host system, the storage subsystem additionally inhibits the host system from reading data from the storage subsystem.

26. A solid state memory subsystem, comprising:
    a solid state, non-volatile memory array;
    a controller that writes data to, and reads data from, the non-volatile memory array in response to operations initiated by a host system;
    a regulation circuit that receives a power signal from the host system and generates a regulated power signal that is provided to the controller;

a voltage detection circuit that monitors the power signal from the host system to detect anomalies therein; and a signal generation circuit that generates a busy signal to the host system when either or both of the following occur: (a) an anomaly is detected by the voltage detection circuit, (b) the controller is in a busy state.

27. The solid state memory subsystem as in claim 26, wherein the busy signal is a signal that, when asserted, blocks the host system from instructing the memory subsystem to perform memory access operations.

28. The solid state memory subsystem as in claim 26, wherein the solid state memory subsystem is configured for insertion by a user into a slot of the host system.

29. The solid state memory subsystem as in claim 28, wherein the regulation circuit is capable of maintaining the regulated power signal to the controller when the power signal from the host system is interrupted, such that the power regulation circuit acts as a backup power supply when power from the host system is interrupted.

30. The solid state memory subsystem as in claim 26, wherein the memory subsystem is a memory card that complies with a CompactFlash, PCMCIA, SmartMedia, MultiMediaCard, SecureDigital or Memory Stick card specification.

31. The solid state memory subsystem as in claim 26, wherein the power regulation circuit comprises a charge pump circuit.

32. The solid state memory subsystem as in claim 26, wherein the busy signal is provided to the host system on a ready/busy signal line of an industry-standard interface.

* * * * *